US009729124B2

(12) United States Patent
Okamoto et al.

(10) Patent No.: US 9,729,124 B2
(45) Date of Patent: Aug. 8, 2017

(54) PIEZOELECTRIC VIBRATION COMPONENT HAVING DISTINGUISHABLE OPPOSING PRINCIPAL SURFACES

(71) Applicant: Murata Manufacturing Co., Ltd., Nagaokakyo-shi, Kyoto-fu (JP)

(72) Inventors: Bunta Okamoto, Nagaokakyo (JP); Hidekazu Oishibashi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 237 days.

(21) Appl. No.: 14/670,251

(22) Filed: Mar. 26, 2015

(65) Prior Publication Data

US 2015/0200647 A1    Jul. 16, 2015

Related U.S. Application Data

(63) Continuation of application No. PCT/JP2013/067472, filed on Jun. 26, 2013.

(30) Foreign Application Priority Data

Sep. 26, 2012   (JP) .................. 2012-212778

(51) Int. Cl.
  *H01L 41/053*   (2006.01)
  *H03H 9/19*   (2006.01)
  (Continued)

(52) U.S. Cl.
  CPC ....... *H03H 9/1021* (2013.01); *H01L 41/0475* (2013.01); *H01L 41/053* (2013.01);
  (Continued)

(58) Field of Classification Search
  CPC .......... H03H 9/17; H03H 9/1021; H03H 9/10; H01L 41/047
  (Continued)

(56) References Cited

U.S. PATENT DOCUMENTS 5,406,682 A * 4/1995 Zimnicki ................. H03H 3/02
                                                         29/25.35
7,948,156 B2 * 5/2011 Satoh .................... H03H 9/1021
                                                         310/364
(Continued)

FOREIGN PATENT DOCUMENTS

JP          5-226963 A      9/1993
JP       2002-344281 A     11/2002
(Continued)

OTHER PUBLICATIONS

International Search Report dated Sep. 3, 2013, International Application PCT/JP2013/067472.

*Primary Examiner* — J. San Martin
(74) *Attorney, Agent, or Firm* — Arent Fox LLP

(57) ABSTRACT

A piezoelectric vibration component that includes a sealed space formed between first and second package members, and a piezoelectric vibrator is bonded to the first package member with first and second conductive adhesive portions. In the piezoelectric vibrator, a first vibration electrode and a first extended electrode are formed on a first surface of a piezoelectric substrate, and a second vibration electrode and a second extended electrode are formed on a second surface of the piezoelectric substrate. At least the second extended electrode provided on the second principal surface has a higher bonding strength with respect to the conductive adhesive than that of the electrodes on the first principal surface. The electrode patterns on the first and second principal surfaces differ from each other so that the first surface and the second surface can be distinguished from each other.

21 Claims, 6 Drawing Sheets

(51) Int. Cl.
  *H03H 9/10* (2006.01)
  *H03H 9/05* (2006.01)
  *H01L 41/047* (2006.01)
  *H03H 9/17* (2006.01)
  *H03H 9/13* (2006.01)

(52) U.S. Cl.
  CPC ............ *H03H 9/0519* (2013.01); *H03H 9/17* (2013.01); *H03H 9/131* (2013.01)

(58) Field of Classification Search
  USPC ................................ 310/320–321, 344, 348
  See application file for complete search history.

(56) References Cited

U.S. PATENT DOCUMENTS

| | | | |
|---|---|---|---|
| 2002/0158699 A1 | 10/2002 | Iizuka et al. | |
| 2009/0167117 A1* | 7/2009 | Yasuike | H03H 3/04 310/361 |
| 2012/0074816 A1* | 3/2012 | Mizusawa | H03H 9/0595 310/344 |

FOREIGN PATENT DOCUMENTS

| | | |
|---|---|---|
| JP | 2003-179456 A | 6/2003 |
| JP | 2007-124442 A | 5/2007 |
| JP | 3925199 B2 | 6/2007 |
| JP | 2008-47982 A | 2/2008 |
| JP | 4066614 B2 | 3/2008 |
| JP | 2009-105776 A | 5/2009 |
| JP | 2012-175499 A | 9/2012 |
| WO | WO 01/67600 A1 | 9/2001 |

* cited by examiner

PIEZOELECTRIC VIBRATION COMPONENT HAVING DISTINGUISHABLE OPPOSING PRINCIPAL SURFACES

CROSS REFERENCE TO RELATED APPLICATIONS

The present application is a continuation of PCT/JP2013/067472 filed Jun. 26, 2013, which claims priority to Japanese Patent Application No. 2012-212778, filed Sep. 26, 2012, the entire contents of each of which are incorporated herein by reference.

FIELD OF THE INVENTION

The present invention relates to piezoelectric vibration components in which a piezoelectric vibrator is disposed in an inner sealed space formed between first and second package members. In particular, the present invention relates to a piezoelectric vibration component in which a piezoelectric vibrator is bonded to a package member with a conductive adhesive portion.

BACKGROUND OF THE INVENTION

Various types of piezoelectric vibration components in which a piezoelectric vibrator is disposed in a sealed space of a package have been proposed.

For example, Patent Document 1 listed below discloses a crystal vibration device in which a quartz oscillator is disposed in an inner space of a package. In this device, the quartz oscillator is bonded to connection electrodes of the package with a conductive adhesive, and is supported in a cantilever manner. According to Patent Document 1, electrode portions of the quartz oscillator to which the conductive adhesive is applied have a multilayer structure in which a Cr film, an Au film, and a Cr film are stacked in that order.

Patent Document 2 listed below discloses a piezoelectric vibration apparatus in which a piezoelectric vibrator is disposed in a package. According to Patent Document 2, electrodes formed on a principal surface of the piezoelectric vibrator to which a conductive adhesive is applied have a structure in which an underlying metal layer, an Au film, and a surface metal film made of Cr, Ni, or nichrome are stacked in that order. An excitation electrode and an identification electrode formed on a surface of the piezoelectric vibrator at the other side each include an underlying metal layer and an Au film stacked on the underlying metal layer.

Parent Document 1: Japanese Patent No. 3925199
Patent Document 2: Japanese Patent No. 4066614

In Patent Documents 1 and 2, the outermost layers of the electrodes provided on the piezoelectric vibrator and the quarts oscillator are formed of Cr films to increase the bonding strength of the conductive adhesive. However, the Cr films are parts of metal film stacks, and the thickness thereof is generally as small as about 0.5 to 5 nm. Therefore, it is difficult to determine whether or not the Cr films are present. Accordingly, when the piezoelectric vibrator is mounted on a package substrate with a back surface, to which a conductive bonding material is to be applied, racing upward by mistake, it difficult to determine that a mounting failure has occurred. If the piezoelectric vibrator is mounted on the package substrate such that a surface having a low bondability to the conductive bonding material faces the package substrate by mistake, there is a risk that the bonding strength will be reduced.

In addition, a principal surface of the piezoelectric vibrator at the side opposite to the side that faces the package substrate is often irradiated with an ion beam or the like for frequency adjustment. When the piezoelectric vibrator is mounted in the inverted orientation by mistake as described above, in particular, when the outermost layer is a Cr film or the like that has a high bonding strength with respect to the conductive adhesive, there is a risk that the frequency adjustment using the ion beam will become difficult.

A method in which only an electrode portion to which the conductive adhesive is applied, that is, only an electrode pad portion to which the conductive adhesive is applied on a principal surface of the piezoelectric vibrator to which the conductive adhesive is applied, is formed so as to have a Cr—Au—Cr multilayer structure. However, according to this method, a plurality of masks must be prepared and replaced in an electrode forming process. Therefore, there is a problem that high production costs are incurred.

SUMMARY OF THE INVENTION

An object of the present invention is to provide a piezoelectric vibration component in which an electrode provided on a principal surface to which a conductive adhesive is applied has a sufficient bonding strength, and with which the principal surface to which the conductive adhesive is applied and a principal surface at the opposite side can be easily distinguished from each other.

A piezoelectric vibration component according to the present invention includes a first package member, a second, package member, a piezoelectric vibrator, a first conductive adhesive portion, and a second conductive adhesive portion. The first package member has a top surface on which first and second connection electrodes are provided. The second package member is bonded to the first package member and forms an inner sealed space together with the first package member. The piezoelectric vibrator is disposed in the sealed space. The piezoelectric vibrator includes a piezoelectric substrate having first and second principal surfaces that oppose each other. A first vibration electrode is provided on the first principal surface of the piezoelectric substrate, and a first extended electrode is electrically connected to the first vibration electrode. A second vibration electrode is provided on the second principal surface of the piezoelectric substrate, and a second extended electrode is electrically connected to the second vibration electrode.

The first and second connection electrodes provided on the first package member are electrically connected to the first and second extended electrodes provided on the piezoelectric vibrator by the first and second conductive adhesive portions, respectively. The piezoelectric vibrator is bonded to the first package member by the first and second conductive adhesive portions.

The second principal surface of the piezoelectric substrate opposes the first package member, and, among the second vibration electrode and the second extended electrode provided on the second principal surface, at lease the second extended electrode is made of a metal material having a higher bonding strength with respect to the corresponding conductive adhesive portion than the first extended electrode.

A second electrode pattern, which includes the second vibration electrode and the second extended electrode on the second principal surface, and a first electrode pattern, which includes the first vibration electrode and the first extended, electrode on the first principal surface, differ from each other so as to be distinguishable from each other.

According to a specific aspect of the piezoelectric vibration component of the present invention, an identification mark is provided at least one of the first principal surface and the second principal surface of the piezoelectric substrate, the identification mark indicating whether the surface on which the identification mark is provided is the first principal surface or the second principal surface.

According to another specific aspect of the piezoelectric vibration component of the present invention, the first extended electrode and the second extended electrode have different shapes. In this case, it is not necessary that the first and second vibration electrodes have different shapes, and it is not necessary to form an additional identification mark. Therefore, the piezoelectric vibration component according to the present, invention is inexpensive, and can be produced without increasing the cost.

According to another specific aspect of the piezoelectric vibration component of the present invention, the piezoelectric substrate is a quartz substrate. Since the quartz substrate is transparent, it is difficult to distinguish the electrode patterns provided on the first and second principal surfaces of the quartz substrate in plan view. However, according to the present invention, as described above, the first, electrode pattern and the second electrode pattern are different from each other so as to be distinguishable from each other. Therefore, even when the quartz substrate is used, the front and back surfaces of the piezoelectric vibrator can be easily distinguished from each other.

According to another specific aspect of the piezoelectric vibration component of the present invention, the first package member is a plate-shaped package substrate, and the second package member is a cap having a downwardly facing opening.

According to another specific aspect of the piezoelectric vibration component of the present invention, the package substrate is a ceramic substrate including a single ceramic layer.

According to another specific aspect of the piezoelectric vibration component of the present invention, the first and second conductive adhesive portions contain an epoxy resin as a main component.

With the piezoelectric vibration component according to the present invention, since the first electrode pattern provided on the first principal surface and the second electrode pattern provided on the second principal surface are distinguishable from each other, the first principal surface and the second principal surface can be easily and reliably distinguished from each other. Therefore, the piezoelectric vibrator can be bonded by the first and second conductive adhesive portions such that the second principal surface, on which the second extended electrode is formed by using a metal material having a high bonding strength with respect to she conductive adhesive, is reliably arranged so as to oppose the first package member. Thus, a piezoelectric vibration component which has a high bonding strength and with which frequency adjustment using an ion beam or the like can be easily performed on the first principal surface can be provided.

BRIEF DESCRIPTION OF TEE DRAWINGS

FIGS. 1(a) and 1(b) are schematic plan views illustrating an electrode structure on a second principal surface of a piezoelectric element included in a piezoelectric vibration component according to a first embodiment of the present invention, and an electrode structure on a first principal surface of the piezoelectric element viewed through a piezoelectric substrate.

Figure 5A:
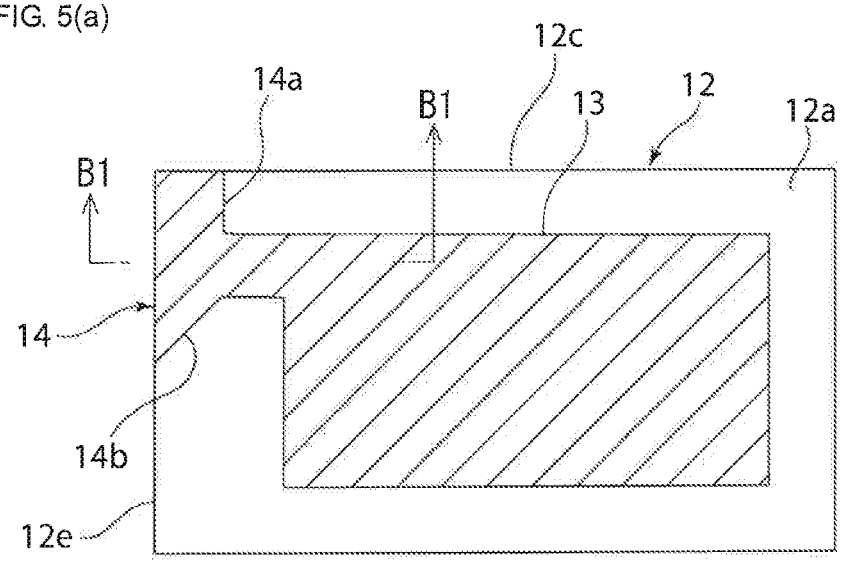
Figure 5B:
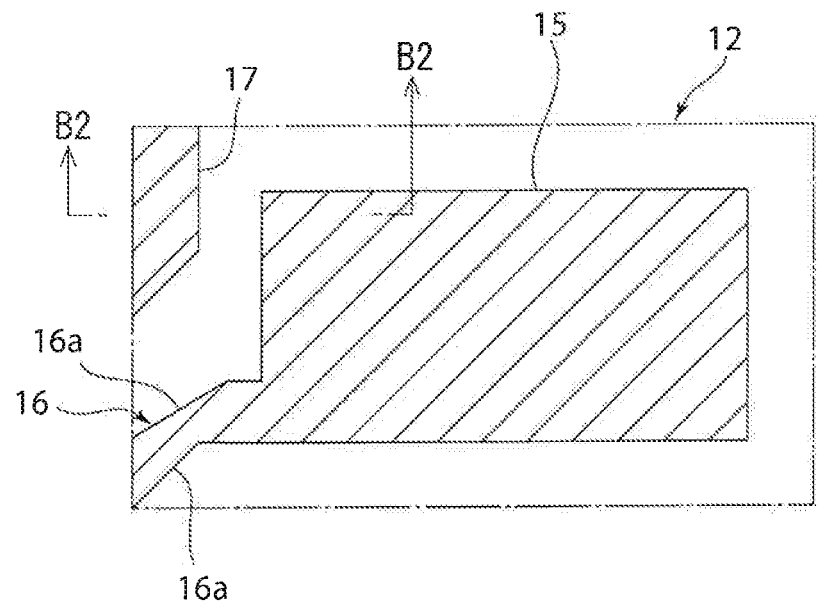

FIGS. 5(a) and 5(b) are schematic plan views illustrating electrode structures on a second principal surface and a first principal surface of a piezoelectric element included in a piezoelectric vibration component according to a second embodiment of the present invention.

Figure 6:
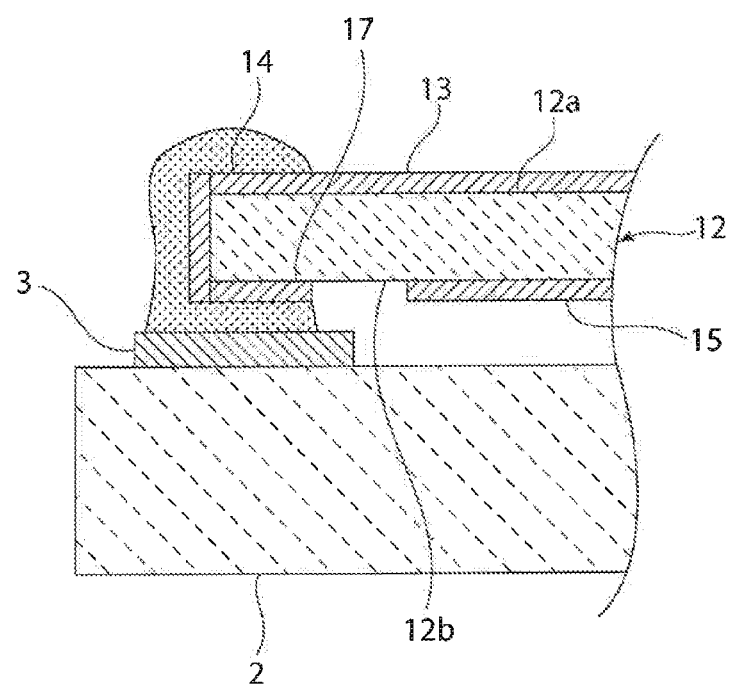

FIG. 6 is a partial enlarged front sectional view of a main portion, of the piezoelectric vibration component according to the second embodiment of the present invention, taken along lines B1-B1 and B2-B2 in FIG. 5.

DETAILED DESCRIPTION OF THE EXEMPLARY EMBODIMENTS

Embodiments of the present invention will now be described with reference to the drawings to clarify the present invention.

Figure 2:
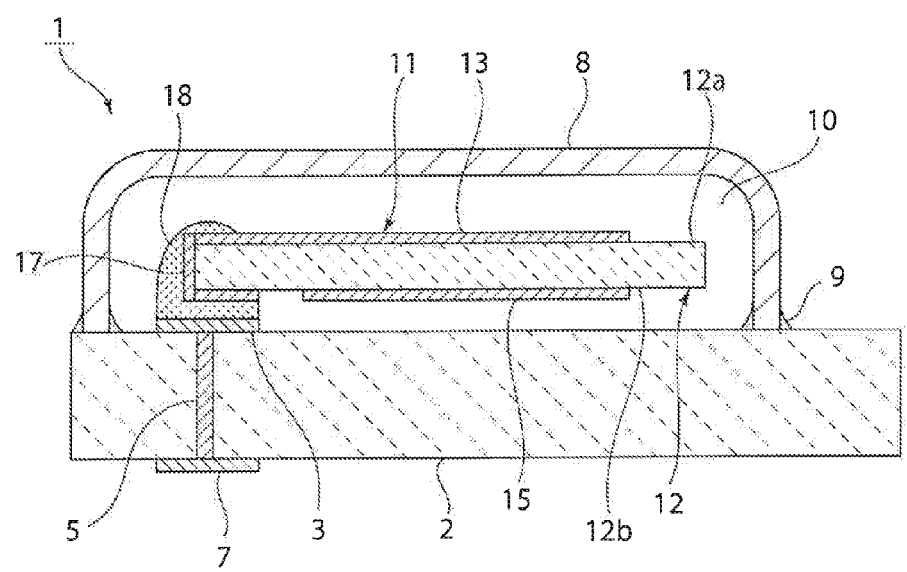
FIG. 2 is a front sectional view of the piezoelectric vibration component according to the first embodiment of the present invention.

FIG. 2 is a front sectional view of a piezoelectric vibration component according to a first embodiment of the present invention.

A piezoelectric vibration component 1 includes a package substrate 2 that serves as a first package member. In the present embodiment, the package substrate 2 is formed of a single insulating ceramic layer. The package substrate 2 may instead be formed of a monolithic ceramic substrate obtained by stacking a plurality of ceramic layers.

Figure 3:
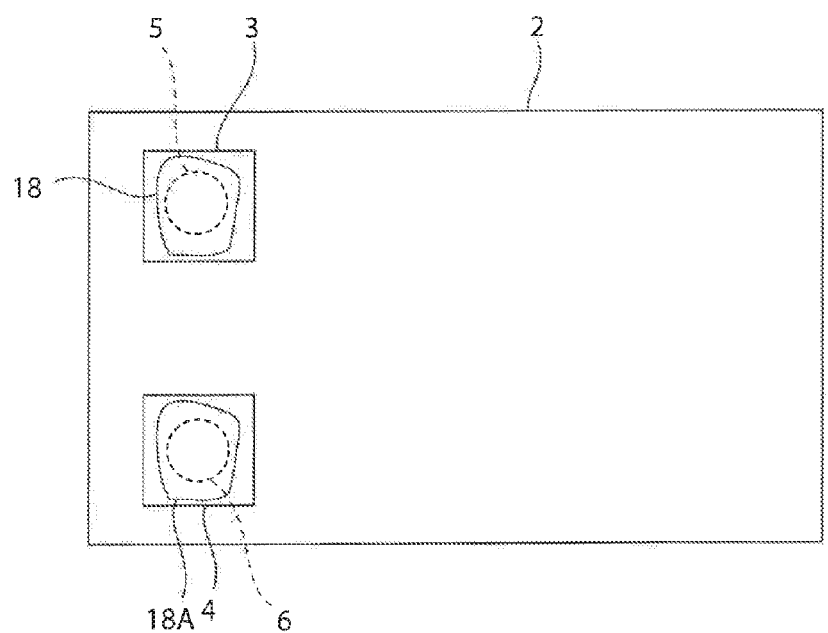
FIG. 3 is a plan view of a package substrate that serves as a first package member included in the piezoelectric vibration component according to the first embodiment.

As illustrated in FIG. 3, connection electrodes 3 and 4 are formed on the top surface of the package substrate 2. The connection electrodes 3 and 4 are connected to top ends of via-hole electrodes 5 and 6, which are shown by the dashed lines in FIG. 3.

As illustrated in FIG. 2, the other end of the via-hole electrode 5 extends to the bottom surface of the package substrate 2, and an external electrode 7 is formed, on the bottom surface of the package substrate 2. Although not illustrated, the bottom end of the via-hole electrode 6 is also electrically connected to an external electrode (not shown).

The connection electrodes 3 and 4 may instead be connected to the respective external electrodes by electrodes provided, on the sides of the substrate instead of the through-hole electrodes.

The above-described connection electrodes 3 and 4, the via-hole electrodes 5 and 6, and the external electrode 7 may be formed of appropriate metals. To increase the bonding strength with respect to a conductive adhesive described below, the outermost layers of the connection electrodes 3 and 4 are preferably made of a metal such as Cr, Ni, or nichrome that has a high bonding strength with respect to the conductive adhesive.

As illustrated in FIG. 2, a cap 8, which serves as a second package member, is bonded to the package substrate 2. Although, the material of the cap 8 is not particularly limited, the cap 8 is made of a metal in the present embodiment. The metal used as the material of the cap 8 is not particularly limited, and say be, for example, 42 Alloy, Cu, or Al. The cap 8 is bonded to the top surface of the package substrate 2 by a bonding material 9. Thus, a sealed space 10 is formed between the package substrate 2 and the cap 8. The above-described connection electrodes 3 and 4 are disposed in the sealed space 10.

Figure 1A:
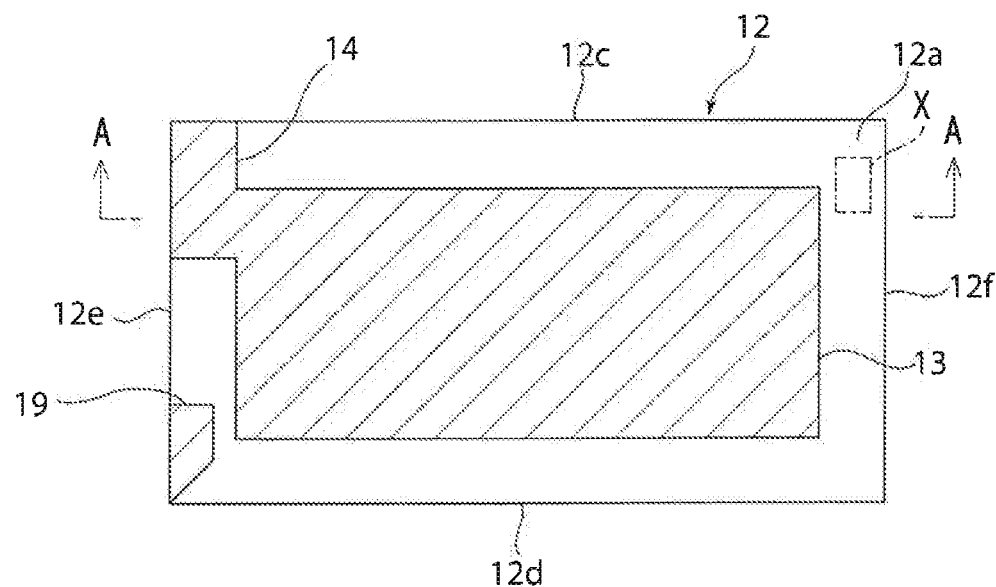

As illustrated in FIG. 2, a piezoelectric vibrator 11 is mounted on the package substrate 2. In the present embodiment, the piezoelectric vibrator 11 includes a piezoelectric substrate 12, which is formed of a quartz substrate. The piezoelectric substrate 12 includes a first principal surface 12a, which is a top surface, and a second principal surface 12b, which is a bottom surface. The first principal surface 12a and the second, principal surface 12b oppose each other. As illustrated in FIG. 1(a), a first vibration electrode 13 is formed on the first principal surface 12a of the piezoelectric substrate 12. A first extended electrode 14 extends continuously from the first vibration electrode 13. Thus, the first extended electrode 14 is electrically connected to the first vibration electrode 13.

The first principal surface 12a has a substantially rectangular shape. More specifically, the first principal surface 12a includes long sides 12c and 12d and short sides 12e and 12f that oppose each other.

The first vibration electrode 13 does not extend to the pair of long sides 12c and 12d nor to the pair of short sides 12e and 12f, and is formed in a central area.

The first extended electrode 14 is formed so as to extend to a corner section between the long side 12c and the short side 12e. More specifically, the first extended electrode 14 extends to a portion of the long side 12c and a portion of the short side 12e.

Figure 1B:
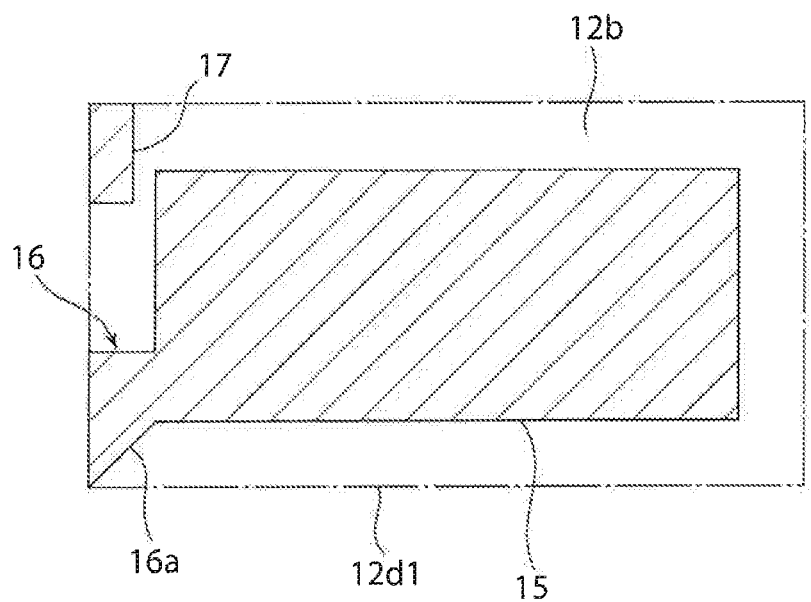

As illustrated in FIG. 1(b), a second vibration electrode 13 is formed on the second principal surface 12b. The second vibration electrode 15 is shaped so as to substantially overlap the first vibration electrode 13 with the piezoelectric substrate 12 provided therebetween.

A second extended electrode 16 is formed so as to be electrically connected to the second vibration electrode 15. The second extended electrode 16 is provided at a corner section at an end of the short side 12e or the first principal surface 12a opposite to the corner section at which the above-described first extended electrode 14 is provided. The second extended electrode it does not extend to the side adjacent to the long side 12d. More specifically, a side 16a of the second extended electrode 16 that extends toward the corresponding corner section extends linearly from an inner side of the extended electrode 16 toward the apex of the corner section. Thus, the second extended electrode 16 does not extend to a long side 12d1, which is a side obtained, by downwardly projecting the long side 12d of the first principal surface 12a.

An electrode pad 17 is provided on one second principal surface 12b at an end of the short side 12e opposite to the end at which the second extended electrode 16 is provided. The electrode pad 17 is formed so as to overlap the first extended electrode 14 with the piezoelectric substrate 12 provided therebetween. Although not illustrated, the electrode pad 17 extends to a side surface of the piezoelectric substrate 12, and is electrically connected to the first extended, electrode 14 on the top surface.

The above-described first and second vibration electrodes 13 and 15, the first and second extended electrodes 14 and 16, and the electrode pads 17 and 19 are formed of metal films. In the present embodiment, the second extended electrode 16 and the electrode pad 17, which correspond to portions to which the conductive adhesive is applied, are formed so that the second extended electrode 16 and the electrode pad 17 have higher bonding strengths with respect to the conductive adhesive than the remaining electrode portions. In the present embodiment, the bonding strength of the second extended electrode 16 with respect to the conductive adhesive may be higher than the bonding strength of the first extended electrode 14 with respect to the conductive adhesive. In other words, the structure is not limited to that of the present embodiment.

Figure 4A:
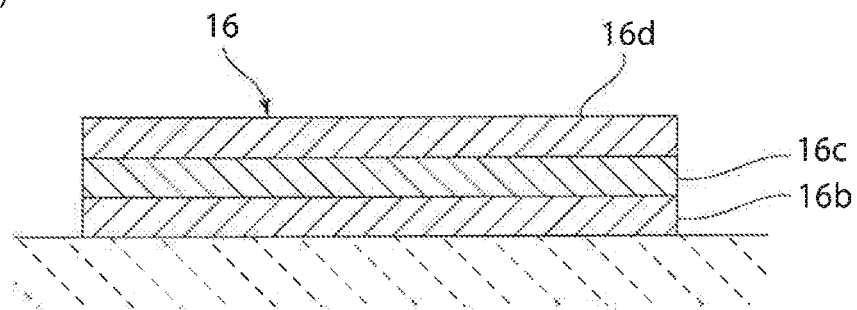
FIGS. 4(a) and 4(b) are schematic partial enlarged front sectional views illustrating the structures of metal film, stacks included in a first extended electrode and a second extended electrode, respectively.
Figure 4B:
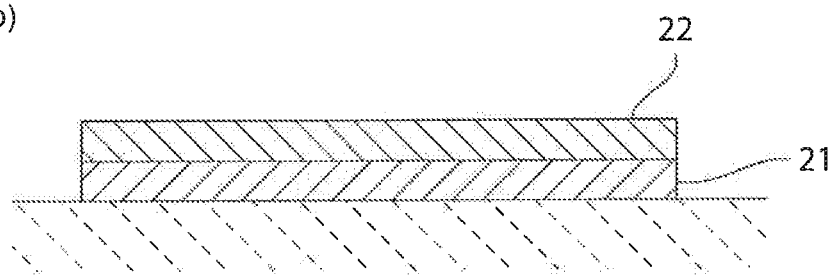

As illustrated in FIG. 4(a), the second extended electrode 16 has a structure in which a Cr film 16b, an Au film 16c, and a Cr thin film 16d are stacked in that order from the bottom. The electrode pad 17 has a similar structure. The remaining electrode portions, which include the first and second vibration electrodes 13 and 15, the first extended electrode 14, and the electrode pad 19, are formed of metal film stacks obtained by stacking an Au film 22 on an underlying metal layer 21, as illustrated in FIG. 4(b).

Referring to FIG. 2 again, the piezoelectric vibrator 11 is bonded to the package substrate 2 with a first conductive adhesive portion 18. The first conductive adhesive portion 18 also has a function of electrically connecting the first extended electrode 14 and the electrode pad 17 to the first connection electrode 3.

The second vibration electrode 15 is electrically connected to the second connection electrode 4 through the second extended electrode 16 and a second conductive adhesive portion 18A, which is applied to the second connection electrode 4 as illustrated in FIG. 3. The second conductive adhesive portion 18a also serves to bond the piezoelectric vibrator 11 to the package substrate 2.

A conductive adhesive obtained by dispersing conductive powder into an epoxy resin is suitable for use as the material of the above-described first and second conductive adhesive portions 18 and 18A. In such a case, the bonding strength can be further increased. The conductive adhesive is not limited to an epoxy-resin-based, conductive adhesive, and may instead be any appropriate conductive adhesive obtained by dispersing conductive filler into any of various thermosetting resins, such as a silicone resin. A thermoplastic resin may be used instead of a thermosetting resin.

The piezoelectric vibration component 1 according to the present embodiment is characterized in that a first electrode pattern provided on the first principal surface 12a of the piezoelectric vibrator 11 differs from a second electrode pattern, provided on the second principal surface 12b of the piezoelectric vibrator 11 in plan view. As illustrated, in FIG. 1(a), the first electrode pattern includes the first vibration electrode 13, the first extended electrode 14, and the electrode pad 19. As described above, the first, extended, electrode 14 is provided so as to extend along the long side 12c and the short side 12e at the corresponding corner section.

The electrode pad 19 is formed such that the electrode pad 19 extends along the short side 12e but does not reach the long side 12d. It is not necessary that the electrode pad 19 be provided.

The second, electrode pattern provided on the second principal surface 12b, which is the bottom surface, includes the second vibration electrode 15, the second extended electrode 16, and the electrode pad 17. The above-described side 16a of the second extended electrode 16 extends to the corresponding corner section. Thus, the extended electrodes included in the first, and second, electrode patterns have different shapes. In other words, even when the piezoelectric vibrator 11 is inverted by mistake, the orientation of the piezoelectric vibrator 11 can be easily and reliably determined since the extended electrodes have different shapes.

In the present embodiment, since the electrode pad 17 is provided, the orientation of the piezoelectric substrate 12 can also be determined by using the electrode pad 17. However, in the case where the piezoelectric substrate 12 is transparent, as in the case where the piezoelectric substrate 12 is a quartz substrate, the electrode pad 17 overlaps the first extended electrode 14 on the first principal surface 12a. Therefore, the orientation cannot be determined by using the electrode pad 17. Also in this case, according to the present embodiment, since the first extended electrode 14 and the second extended electrode 16 have different planar shapes, they do not overlap each other in plan view, and the orientation can be reliably determined. The first electrode pattern and the second electrode pattern may have different shapes in other regions.

In addition, in the present embodiment, the electrode pad 17, to which the conductive adhesive portion 18 is applied, and the second extended electrode 16 are structured as metal film stacks having relatively high bonding strengths with respect to the conductive adhesive.

The conductive adhesive contains the above-described epoxy resin or silicone resin as the main component, and conductive filler, such as Ag powder, is mixed into the resin. When this type of conductive adhesive is heated, one conductive adhesive is rapidly cured in regions around the filler, and contracts when it is cured. Assuming that the electrode to which the conductive adhesive is applied is made of a metal like Au, the metal like Au generally has such characteristics that substances with smaller molecular weights adhere to the metal, more quickly. Therefore, it can be assumed that the above-described conductive filler does not easily adhere to the surface of the electrode. Accordingly, when the conductive adhesive is cured, there is a possibility that the conductive filler will become separated, from the surface of the electrode and a resin portion will be formed therebetween. As a result, in the above-described structure, for example, there is a risk that a conduction failure will occur between the second extended electrode 16 and the second connection electrode 4 or between the electrode pad 17 and the first connection electrode 3.

However, according to the present embodiment, the electrode structures of the second extended electrode 16 and the electrode pad 17, that is, portions to which the conductive adhesive is applied, are metal film stacks in which the outermost layer is a Cr thin film. More specifically, the electrode structures are metal film stacks in which the Cr film 16b, the Au film 16c, and the Cr thin film 16d are stacked in that order. In this case, since the outermost layer is the Cr thin film 16d, the bonding strength of the conductive adhesive can be sufficiently increased.

In the present embodiment, the remaining electrode portions including the first vibration electrode 13 have a structure in which the outermost layer is the Au film 22. Therefore, in the state in which the piezoelectric vibrator 11 is mounted on the package substrate 2, frequency adjustment can be easily performed by irradiating the piezoelectric vibrator 12 with an ion beam or the like from above.

The material of the remaining electrode portions including the first vibration electrode 13 is not limited, to Au, and may instead be any appropriate metal with which frequency adjustment can be performed by irradiation with an ion beam or the like.

In the case where the outermost layer is above-described Cr thin film, since the Cr thin film has a small thickness, it is difficult to determine the region in which the Cr thin film is provided. However, according to tire present embodiment, as described above, the first extended electrode 14 and the second extended electrode 16 nave different shapes. Therefore, the orientation can be easily determined.

Therefore, according to the present embodiment, the bonding strength between the piezoelectric vibrator 11 and the package substrate 2 can be sufficiently increased, and the orientation of the piezoelectric vibrator 11 can be easily determined. In addition, frequency adjustment can be easily performed by processing the first vibration electrode 13 on the top side of the piezoelectric vibrator 11 with an ion beam or the like.

As described above, according to the present embodiment, the first and second extended electrodes 14 and 16 are simply formed in different shapes. Therefore, the orientation can be determined without increasing the number of processes or the number of materials. Accordingly, the possibility that the cost of the piezoelectric vibration component will increase is low.

In the above-described, embodiment, the second extended electrode 16 is formed in a shape that differs from the shape of the first extended electrode 14. However, as illustrated in FIG. 1(a), an identification mark shown by the one-dot chain line X may be additionally formed so that the orientation can be more reliably determined. The identification mark shown by the one-dot chain line is located near the loner side 12c in a direction along the short side 12f. More specifically, the identification mark is formed in a pattern that is not line-symmetrical about the center line that passes through the center of the piezoelectric substrate 12 and extends in the longitudinal direction. Thus, an identification mark that appears at different locations depending on the orientation may be formed so that she orientation of the piezoelectric substrate 12 can be determined.

FIGS. 5(a) and 5(b) are schematic plan views illustrating electrode structures on a first principal surface and a second principal surface of a piezoelectric substrate included in a piezoelectric vibration component according to a second embodiment of the present invention.

As illustrated in FIG. 5(a), on a first principal surface 12a, a first extended electrode 14 that extends continuously from a first vibration electrode 13 is located at a corner section formed by a long side 12c and the short side 12e. The first extended electrode 14 extend along both the long side 12c and the snort side 12e at the corner section. A second extended electrode 16 formed on a second principal surface 12b includes sides 16a and 15a that extend at an angle in a similar manner. The area of an electrode portion between the sides 16a and 16a is smaller than the area of an electrode portion between sides 14a and 14b of the first extended electrode 14. The first extended electrode 14 is electrically connected to an electrode pad 17 formed on the second principal surface 12b through an electrode film formed on a side surface.

To prevent disconnection, the areas of the first extended electrode 14 and the electrode pad 17 are sufficiently larger than that of the second extended electrode 16, as described above. Therefore, in the present embodiment, disconnection between the first extended electrode 14 and the electrode pad 17 does not easily occur.

More specifically, the first extended, electrode 14 can be more reliably electrically connected to a first connection electrode on a package substrate, as illustrated in FIG. 6. Other structures of the second, embodiment are similar to those of the first embodiment. Therefore, components that are the same as those in the first embodiment are denoted by the same reference numerals, and descriptions thereof are thus omitted.

Also in the second embodiment, the first extended electrode 14 and the second extended electrode 16 have different planar shapes. Therefore, the first principal surface 12a and the second principal surface 12b can be easily and reliably distinguished from each other.

In the above-described first and second, embodiments, the first package member is the package substrate 2 and the second package member is the cap 8. However, the first and second package members may have other shapes. For example, the first package member may have an upwardly facing opening, and a sealed space may be formed by bonding a plate-shaped lid member, which serves as the second, package member, to the first package member so as to cover the opening.

In addition, the materials of the first and second package members are not limited to a ceramic material and a metal, and other materials, such as a synthetic resin, may instead be used. In addition, the piezoelectric vibrator 11 is not limited to those including a quartz substrate, and may instead be a piezoelectric element including a piezoelectric ceramic plate. The present invention is further effective in the case where the piezoelectric substrate is transparent, as described above.

REFERENCE SIGNS LIST piezoelectric vibration component
package substrate
first connection electrode
second connection electrode
5, 6 via-hole electrode
7 external electrode
8 cap
9 bonding material
10 sealed space
11 piezoelectric vibrator
12 piezoelectric substrate
12a first principal surface
12b second principal surface
12c, 12d, 12d1 long side
12e, 12f short side
13 first vibration electrode
14 first extended, electrode
14a, 14b side
15 second vibration electrode
16 second extended electrode
16a side
16b Cr film
16c Au film
16d Cr thin film
17, 19 electrode pad
18 first conductive adhesive portion
18A second, conductive adhesive portion
21 underlying metal layer
22 Au film

The invention claimed is:

1. A piezoelectric vibration device comprising:
   a package member having a surface with first and second connection electrodes disposed thereon;
   a piezoelectric vibrator including:
      a piezoelectric substrate having first and second surfaces that oppose each other, the piezoelectric substrate being a quartz substrate,
      a first vibration electrode disposed on the first surface of the piezoelectric substrate,
      a first extended electrode disposed on the first surface of the piezoelectric substrate and that is electrically connected to the first vibration electrode,
      an electrode pad disposed on the second surface of the piezoelectric substrate and electrically connected to the first extended electrode, the electrode pad overlapping the first extended electrode in a direction normal to the piezoelectric substrate with the piezoelectric substrate disposed between the electrode pad and the first extended electrode,
      a second vibration electrode disposed on the second surface of the piezoelectric substrate, and
      a second extended electrode disposed on the second surface of the piezoelectric substrate and that is electrically connected to the second vibration electrode;
   a first conductive adhesive member applied to the electrode pad and that secures the piezoelectric vibrator to the package member and that electrically connects the first connection electrode to the first extended electrode; and
   a second conductive adhesive member applied to the second extended electrode and that secures the piezoelectric vibrator to the package member and that electrically connects the second connection electrode to the second extended electrode,
   wherein the first and second conductive adhesive members are secured to at least a same side of the second surface of the piezoelectric substrate,
   wherein the first vibration electrode, the first extended electrode on the first surface and the electrode form a first electrode pattern, and the second vibration electrode and the second extended electrode on the second surface form a second electrode pattern, and
   wherein the first and second electrode patterns differ from each other from a plan view of the first and second surfaces of the piezoelectric vibrator.

2. The piezoelectric vibration device according to claim 1, further comprising a cap that is affixed to the package member to form a sealed space together with the package member and the piezoelectric vibrator is disposed in the sealed space.

3. The piezoelectric vibration device according to claim 2, wherein the package member is a plate-shaped package substrate and the cap has a downwardly facing opening.

4. The piezoelectric vibration device according to claim 3, wherein the package substrate is a ceramic substrate including a single ceramic layer.

5. The piezoelectric vibration device according to claim 1, wherein the second surface of the piezoelectric substrate opposes the package member.

6. The piezoelectric vibration device according to claim 1, wherein the second extended electrode comprises a metal material having a higher bonding strength with respect to the corresponding conductive adhesive member than the first extended electrode.

7. The piezoelectric vibration device according to claim 1, wherein the piezoelectric substrate comprises an identification mark on at least one of the first surface and the second surface.

8. The piezoelectric vibration device according to claim 7, wherein the identification mark indicates whether the surface on which the identification mark is disposed is the first surface or the second surface.

9. The piezoelectric vibration device according to claim 1, wherein the first extended electrode and the second extended electrode have different shapes from the plan view of the first and second surfaces of the piezoelectric vibrator.

10. The piezoelectric vibration device according to claim 1, wherein the piezoelectric substrate is a quartz substrate.

11. The piezoelectric vibration device according to claim 1, wherein the first and second conductive adhesive member comprise an epoxy resin.

12. The piezoelectric vibration device according to claim 1, wherein the first extended electrode comprises a rectangular shape.

13. The piezoelectric vibration device according to claim 12, wherein the first extended electrode directly contacts the first vibration electrode.

14. The piezoelectric vibration device according to claim 1, wherein the piezoelectric substrate comprises a rectangular shape and the first extended electrode extends to one corner thereof.

15. The piezoelectric vibration device according to claim 14, wherein the electrode pad is further disposed on a side of the piezoelectric substrate between the first surface and the second surface.

16. The piezoelectric vibration device according to claim 1, wherein the first vibration electrode does not extend to any edge of the first, surface of the piezoelectric substrate.

17. The piezoelectric vibration device according to claim 16, wherein the second vibration electrode does not extend to any edge of the second surface of the piezoelectric substrate.

18. The piezoelectric vibration device according to claim 1, wherein the second extended electrode comprises an Au film disposed between a pair of Cr films.

19. The piezoelectric vibration device according to claim 1, wherein the piezoelectric substrate comprises a rectangular shape and the second extended electrode comprises at least one side that extends toward an apex of a corner section of the piezoelectric substrate.

20. The piezoelectric vibration device according to claim 1, wherein a side of the second extended electrode extends linearly towards an apex of a corresponding corner section of the piezoelectric substrate in a plan view of the first and second surfaces of the piezoelectric vibrator.

21. The piezoelectric vibration device according to claim 1, wherein the electrode pad comprises a metal material having a higher bonding strength to the first conductive member that a bonding strength of the first extended electrode to the first conductive member.

* * * * *